United States Patent
Conn et al.

(10) Patent No.: US 7,046,071 B1
(45) Date of Patent: May 16, 2006

(54) SERIES CAPACITOR COUPLING MULTIPLEXER FOR PROGRAMMABLE LOGIC DEVICES

(75) Inventors: Robert O. Conn, Los Gatos, CA (US); Kameswara K. Rao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 318 days.

(21) Appl. No.: 10/633,727

(22) Filed: Aug. 4, 2003

(51) Int. Cl.
H03K 17/62 (2006.01)
H03K 17/693 (2006.01)

(52) U.S. Cl. ..................... 327/407; 327/408
(58) Field of Classification Search ............... 327/407, 327/408, 409, 410, 99, 298
See application file for complete search history.

(56) References Cited

U.S. PATENT DOCUMENTS

| | | | | |
|---|---|---|---|---|
| 5,329,172 A | * | 7/1994 | Kohdaka | 327/63 |
| 5,410,192 A | * | 4/1995 | Yamada | 327/408 |
| 5,835,045 A | * | 11/1998 | Ogawa et al. | 341/155 |
| 5,856,754 A | * | 1/1999 | Yamashita | 327/407 |
| 5,982,220 A | * | 11/1999 | Kim | 327/408 |
| 6,114,896 A | * | 9/2000 | Jung | 327/407 |
| 2004/0095181 A1 | * | 5/2004 | Ohtsuka et al. | 327/408 |

* cited by examiner

Primary Examiner—Tuan T. Lam
(74) Attorney, Agent, or Firm—T. Lester Wallace (57) ABSTRACT

A series capacitor coupling (SCC) structure is controllable to capacitively couple a data input lead of the SCC structure to an output lead of the SCC, or to de-couple the data input lead from the data output lead. An SCC is controlled by a control bit stored in an associated memory cell. A multiplexer is fashioned out of a plurality of such SCC structures such that the edges of a digital signal received on a selected one of a plurality of multiplexer data input leads is coupled through the SCC structures onto an intervening node. The edges of the digital signal on the intervening node are then latched to recreate the incoming digital signal and the latched signal is output onto a multiplexer data output lead. The multiplexer is very fast and has a low leakage current in comparison to conventional transmission gate multiplexers used in programmable logic devices.

20 Claims, 5 Drawing Sheets

SERIES CAPACITOR COUPLING MULTIPLEXER FOR PROGRAMMABLE LOGIC DEVICES

FIELD OF THE INVENTION

The present invention relates to multiplexer structures, and more specifically to multiplexer structures for use in programmable logic devices.

BACKGROUND INFORMATION

Figure 1:
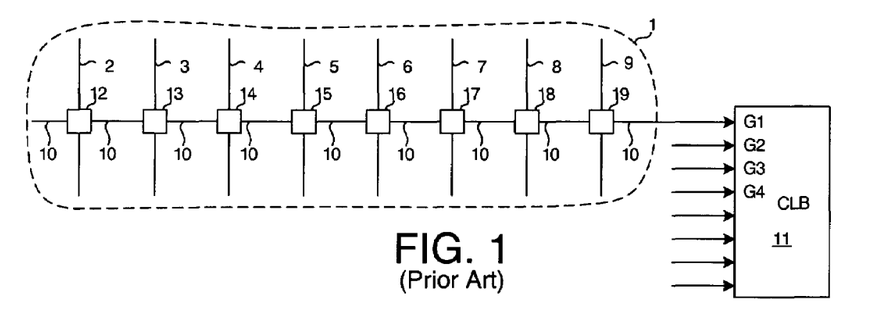
FIG. 1 (Prior Art) is a simplified schematic view of portion of a field programmable gate array (FPGA) involving a multiplexer.

FIG. 1 (Prior Art) is a simplified diagram of a portion of a programmable logic device. An example of a programmable logic device is a field programmable gate array (FPGA). The programmable logic device includes a programmable interconnection structure 1 that can be programmed to couple a signal on a selected one of a plurality of vertically extending conductors 2–9 onto a horizontally extending conductor 10 such that the signal is communicated to the right to the G1 input lead of a configurable logic block (CLB) 11. One of a plurality of programmable interconnection points 12–19 is disposed at each crossing location where a vertically extending conductor crosses the horizontally extending conductor. Each programmable interconnection point includes a memory cell which determines whether the two crossing conductors are coupled together.

Figures 2, 3, 4:
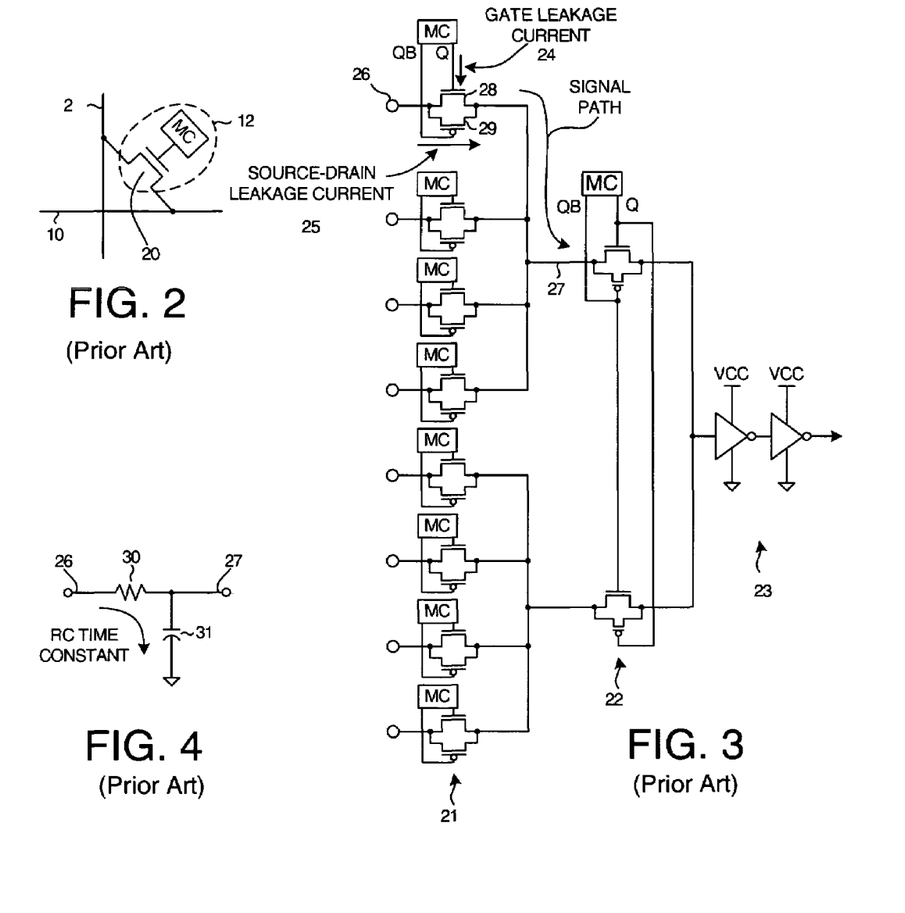
FIG. 2 (Prior Art) is a diagram illustrating a programmable interconnect point in the multiplexer of FIG. 1.
FIG. 3 (Prior Art) is a simplified schematic view of a multi-stage transmission gate multiplexer structure used to realize the multiplexer of FIG. 1.
FIG. 4 (Prior Art) is a diagram illustrating an RC time constant delay path in the conventional multiplexer structure of FIG. 3.

FIG. 2 (Prior Art) is a diagram illustrating one of the programmable interconnection points 12. It includes a memory cell and a transistor 20. Transistor 20 is coupled between vertically extending conductor 2 and horizontally extending conductor 10. If the memory cell contains a first digital logic value, then the transistor is controlled to be conductive such that the two crossing conductors are coupled together. If, on the other hand, the memory cell contains a second digital logic value, then the transistor is controlled to be non-conductive and the two crossing conductors are not coupled together.

To couple a signal on a selected one of vertically extending conductors 2–9 onto horizontally extending conductor 10, the programmable interconnection point at the intersection of the two conductors is programmed such that the two crossing conductors are coupled together. The programmable interconnection points located at the intersections of the other vertically extending conductors and the horizontally extending conductor are programmed such that their transistors are non-conductive. The structure of FIG. 1 can therefore be programmed to perform a multiplexer function in that the structure couples a signal on a selected one of the vertically extending conductors 2–9 onto the G1 input lead of CLB 11.

Although such a multiplexer structure in a programmable logic device is often illustrated and described as shown in FIGS. 1 and 2, the actual multiplexer structure may be implemented in several different ways on an actual integrated circuit. FIG. 3 is a simplified diagram of one possible implementation. This implementation involves a first stage of transmission gates 21, followed by a second stage of transmission gates 22, followed by an output buffer stage 23. Although the first transmission gate stage is illustrated with each of its transmission gates being controlled by its own dedicated memory cell, the first transmission gate stage is sometimes implemented in other ways. Sometimes there are fewer memory cells, and each of those memory cells controls two transmission gates, one in the upper group of four transmission gates and the other in the lower group of four transmission gates. Sometimes there are only two memory cells, and the outputs of the two memory cells are decoded to drive the eight transmission gates of the first stage.

Regardless of which of the many ways the multiplexer structure is implemented, a small gate leakage current 24 flows into the gate electrode of each of the transistors of the transmission gates. A small source-to-drain leakage current 25 also can flow through the transistors of the transmission gates. Although these leakage currents are small for an individual transmission gate, there are often a very large number of these multiplexer structures in a large state of the art programmable logic device. The combined leakage current for all the transmission gates of the programmable logic device can amount to a significant and undesirable leakage current.

To reduce the leakage current problem, the P-channel transistors of the transmission gates of FIG. 3 can be omitted. This eliminates the leakage current due to the P-channel transistors, but results in other unfortunate consequences. For example, a signal flowing through one of the N-channel transistors from left to right (for example, from input node 26 to intermediate node 27) will suffer a voltage drop of approximately one threshold voltage. The size of the signal is reduced, resulting in reduced noise margin and other problems. Moreover, the signal path from node 26 to node 27 is more resistive than the signal path would have otherwise been had conductive P-channel transistor 29 been connected in parallel with the N-channel transistor 28.

FIG. 4 (Prior Art) illustrates a problem associated with the increased resistance. The resistor symbol 30 represents the source-to-drain resistance between nodes 26 and 27 when P-channel transistor 29 is omitted. The capacitor symbol 31 represents the capacitance to ground of node 27. A signal passing from node 26 to node 27 is delayed due to the RC circuit. It is therefore seen that removing the P-channel transistors of the transmission gates of FIG. 3 improves the leakage current problem but gives rise to other problems. A solution is desired.

SUMMARY

A series capacitor coupling (SCC) structure involves two series-coupled capacitors. The SCC structure can be controlled to capacitively couple a data input lead of the SCC structure to a data output lead of the SCC, or to decouple the data input lead from the data output lead. The SCC is controlled by a bit of control information stored in an associated memory cell.

A multiplexer structure is fashioned out of a plurality of such SCC structures such that the edges of a digital signal received on one of a plurality of multiplexer data input leads are coupled through a tree of SCC structures and onto an intervening node. The edges of the digital signal on the intervening node are then latched by an output latch to recreate the incoming digital signal. The output latch outputs the recreated signal onto the data output lead of the multiplexer.

In one embodiment, the output latch includes an amplifier portion that biases the signal on the intervening node, amplifies the signal, and supplies the amplified signal to an output latch portion. The output latch portion is a cross-coupled inverter latch.

In one embodiment of the multiplexer structure, each of the series capacitor coupling (SCC) structures is realized on an integrated circuit as three strips of metal. The three strips of metal extend parallel to one another in one of the upper layers of metalization on the integrated circuit. The center strip is a common capacitor plate. Sidewall capacitance between the metal strip on one side of the common capacitor plate and the common capacitor plate itself constitutes a capacitance of a first capacitor of the SCC structure. Sidewall capacitance between the metal strip on the opposite side of the common capacitor plate and the common capacitor plate itself constitutes a capacitance of a second capacitor of the SCC structure. The first and second capacitors are coupled together in series by the common capacitor plate.

A conductive via or stack of conductive vias extends from the common capacitor plate downward into the integrated circuit to a memory cell structure. The transistors of the memory cell structure are formed into the semiconductor substrate material below the metal strip capacitor structure. Storing a first digital value in the memory cell structure causes the common capacitor plate to be allowed to float. In this state, the metal plate on one side of the common capacitor plate is capacitively coupled to the metal plate on the other side of the common capacitor plate. Storing a second digital value in the memory cell structure, on the other hand, causes the common capacitor plate to be held at a DC voltage (for example, ground potential). In this state, the metal plate on one side of the common capacitor plate is not capacitively coupled to the metal plate on the other side of the common capacitor plate.

In accordance with one specific embodiment, a programmable interconnect structure of a field programmable gate array (FPGA) includes an eight-to-one multiplexer structure utilizing SCC structures. The multiplexer structure selectively couples a signal on one of eight interconnect lines onto an input lead of a configurable logic block (CLB). The propagation delay through the eight-to-one multiplexer structure from one of the data input leads to the data output lead of the multiplexer structure is small (for example, approximately 50 picoseconds). Due to the series-coupled capacitors of the SCC structures, the input capacitance on the data input leads of the multiplexer structure is small (for example, is approximately 0.01 pF). Moreover, the eight-to-one multiplexer structure has a low leakage current in comparison to a conventional transmission gate eight-to-one multiplexer used in a conventional FPGA. The leakage current due to the pass gates of the conventional multiplexer structure of FIG. 3 is eliminated because the pass gates are not present in the SCC multiplexer structure.

Other structures and methods are described in the detailed description below. This summary does not purport to define the invention. The invention is defined by the claims.

BRIEF DESCRIPTION OF THE FIGURES

The accompanying drawings, where like numerals indicate like components, illustrate embodiments of the invention.

DETAILED DESCRIPTION

Figure 5:
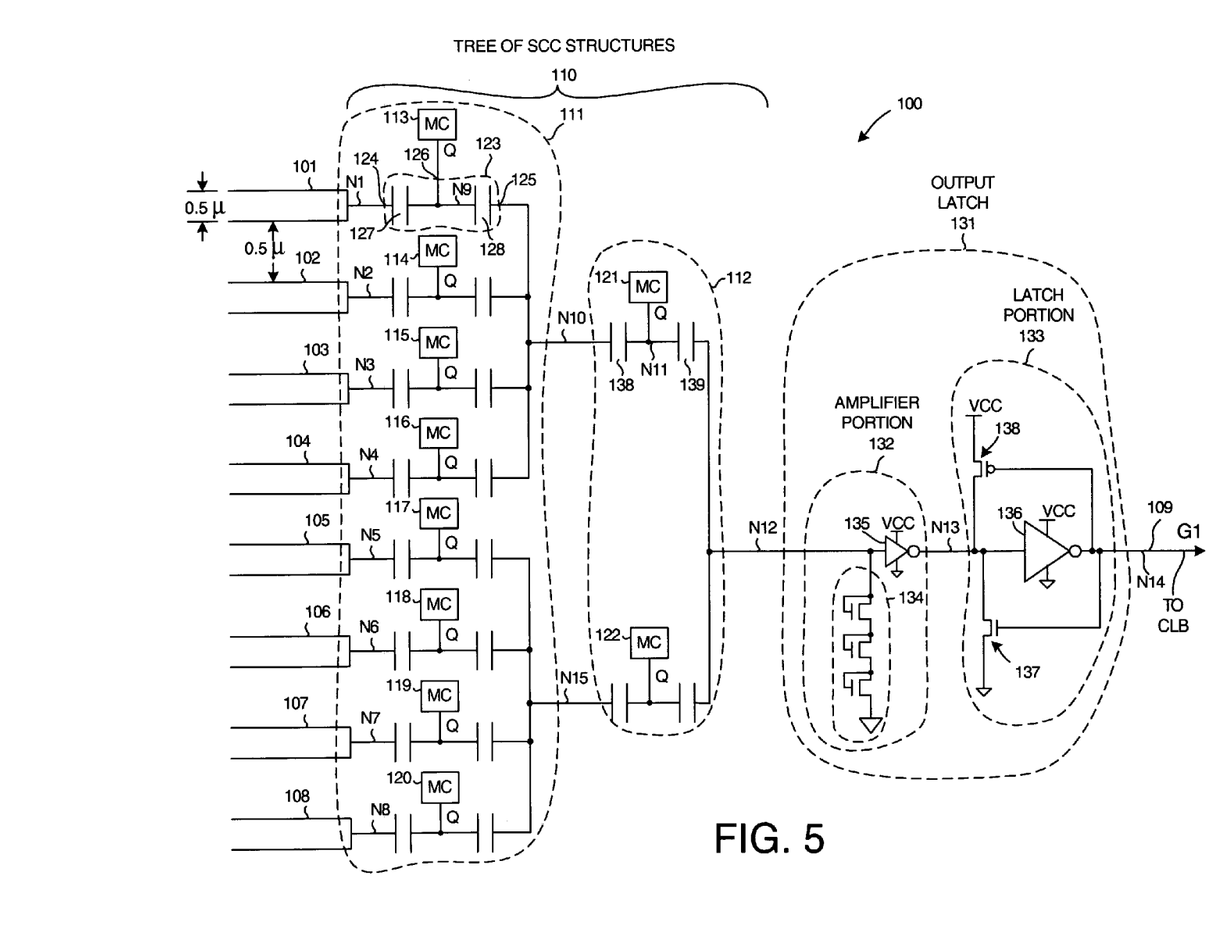
FIG. 5 is a simplified schematic diagram of a multiplexer structure in accordance with one specific embodiment of the present invention.

FIG. 5 is a simplified circuit diagram of a multiplexer structure 100 in accordance with one specific embodiment. Multiplexer structure 100 has a plurality of data input leads 101–108 and a data output lead 109. A digital signal on a selected one of the data input leads 101–108 is capacitively coupled via a two-stage tree 110 of series capacitor coupling (SCC) structures onto an intermediate node N12. The two-stage tree 110 includes a first stage 111 and a second stage 112. Which one of the eight data input leads 101–108 is coupled to intermediate node N12 is determined by control information stored in an associated plurality of memory cells 113–122.

One of the series capacitor coupling (SCC) structures 123 is shown encircled by a dashed line in FIG. 5. SCC structure 123 is representative of the other SCC structures of FIG. 5. SCC structure 123 has a data input lead 124, a data output lead 125, and a control lead 126. Data input lead 124 is coupled to, or is, the data input lead 101 of multiplexer structure 100. Data output lead 124 is coupled to, or is, an intermediate node N10 of multiplexer structure 100. Control lead 126 is coupled to a Q data output lead of memory cell structure 113.

If SCC structure 123 is to capacitively couple its data input lead 124 to its data output lead 125, then a digital logic "0" is loaded into memory cell structure 113. If a digital logic "0" is stored in memory cell structure 113, then the memory cell structure does not drive its Q output lead with either a digital logic "1" or a digital logic "0". Rather, the memory cell structure 113 allows its Q output to float. Because the Q output lead of the memory cell structure 113 is coupled to control lead 126 of SCC structure 123, the control lead of SCC structure 123 is allowed to float.

In the embodiment of FIG. 5, SCC structure 123 includes a first capacitor 127 and a second capacitor 128. First capacitor 127 includes a first plate that is the data input lead of SCC structure 123 and a second plate that is coupled to the control lead of SCC structure 123. Second capacitor 128 includes a first plate that is same structure as the second plate of first capacitor 127. The second capacitor 128 includes a second plate that is coupled to intermediate node N10. It is therefore seen that the two capacitors 127 and 128 share a common center plate that is either the control lead, or is coupled to the control lead, of SCC structure 123.

If the common center plate is allowed to float, then a signal transition on the data lead 124 of SCC structure 123 is capacitively coupled from the first capacitor 127, through the common center plate, and through the second capacitor 128, and onto the intermediate node N10.

If, on the other hand, SCC structure 123 is to keep its data input lead 124 de-coupled from its data output lead 125, then a digital logic "1" is loaded into memory cell structure 113. If a digital logic "1" is loaded into memory cell structure 113, then the common center plate is held at a DC voltage. In the example of FIG. 5, the common center plate is shorted to ground potential. Because the voltage on the common center plate cannot change, a signal transition on the data input lead 101 of multiplexer structure 100 is not capacitively coupled to intermediate node N10.

It is therefore seen that SCC structure 123 capacitively couples its data input lead 124 to its data output lead 125 if its control lead 126 is allows to float, whereas SCC structure 123 keeps its data input lead 124 capacitively de-coupled from its data output lead 125 if its control lead 126 is grounded.

Figure 6:
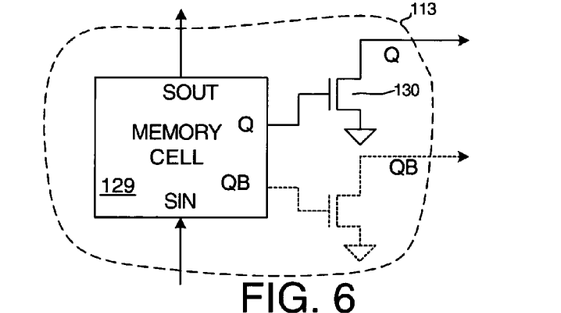
FIG. 6 is a simplified diagram of a memory cell structure of the multiplexer structure of FIG. 5.

FIG. 6 is diagram of one of the memory cell structures (memory cell structure 113) of FIG. 5. Memory cell structure 113 includes a one-bit memory cell 129 and an N-channel pull-down transistor 130. If memory cell 129 stores a digital logic "0", then ground potential is present on the Q output lead of memory cell 129. N-channel transistor 130 is therefore non-conductive. The Q output lead of memory cell structure 113 is therefore not shorted to ground by transistor 130 and is allowed to float. If, on the other hand, memory cell 129 stores a digital logic "1", then the supply voltage VCC is present on the Q output lead of memory cell 129. N-channel transistor 130 is therefore conductive. The Q output lead of memory cell structure 113 is therefore shorted to ground potential by pull-down transistor 130. Accordingly, loading memory cell structure 113 of FIG. 5 with a digital logic "0" causes SCC structure 123 to capacitively couple node N1 to node N10, whereas loading memory cell structure 113 with a digital logic "1" causes SCC structure 123 to de-couple node N1 from node N10.

By loading the memory cell structures 113–122 of the multiplexer structure 100 with appropriate digital values, a selected one of data input leads 101–108 can be capacitively coupled by the two stages of SCC structures to intermediate node N12. In one embodiment, the memory cells of the memory cell structures 113–122 are coupled together in serial fashion such that their various bits can be loaded in serial fashion. The structure and loading of these memory cells can be the same as the structure and loading of configuration memory cells within an SRAM-based FPGA.

The signal edge on node N1, once it has passed through the two-stage tree 110 of SCC structures, reaches intermediate node N12. The signal edge is then latched by an output latch 131. The resulting latched signal is then output onto the data output lead 109 of multiplexer structure 100.

The data input leads 101–108 of the multiplexer structure of FIG. 5 may, for example, be coupled to a set of vertically extending conductors of a programmable interconnect structure of a programmable logic device such as shown in FIG. 1. Capacitive loading on the vertically extending conductors of the FPGA is small because the capacitors within the receiving SCC structures are connected in series. The data output lead 109 of the multiplexer structure of FIG. 5 may, for example, be coupled to the G1 data input lead of a configurable logic block (CLB) of a programmable logic device such as shown in FIG. 1. In particular, the data output lead 109 of the multiplexer structure of FIG. 5 may be coupled to an input lead of a logic array block (LAB) of a programmable logic device made by Altera Corporation, of San Jose, Calif.

In the specific embodiment of FIG. 5, output latch 131 includes an amplifier portion 132 and a latch portion 133. Amplifier portion 132 includes a biasing structure 134 and an amplifier 135. Biasing structure 134 operates to bias node N12 to a voltage close to the switching point of amplifier 135. In the present example, the biasing structure includes a string of three diode-connected N-channel transistors. All transistors in the structure of FIG. 5 are made using the same 90 nanometer CMOS process used to make the remainder of multiplexer structure 100. The supply voltage VCC used to power amplifier 135 is 1.2 volts and the switching point of amplifier 135 is approximately 0.6 volts. The threshold voltage of each of three transistors of the biasing structure is 0.2 volts. Because there are three transistors in series in biasing structure 134, node N12 is biased at approximately 0.6 volts which is the switching point of amplifier 135.

Latch portion 133 comprises a CMOS inverter 136 as well as a relatively small CMOS keeper inverter. The N-channel transistor 137 and P-channel transistor 138 making up the CMOS keeper inverter are illustrated in FIG. 5. The drive strength of amplifier 135 is large enough such that amplifier 135 can overpower the small keeper inverter and cause latch portion 133 to flip states.

Figure 7:
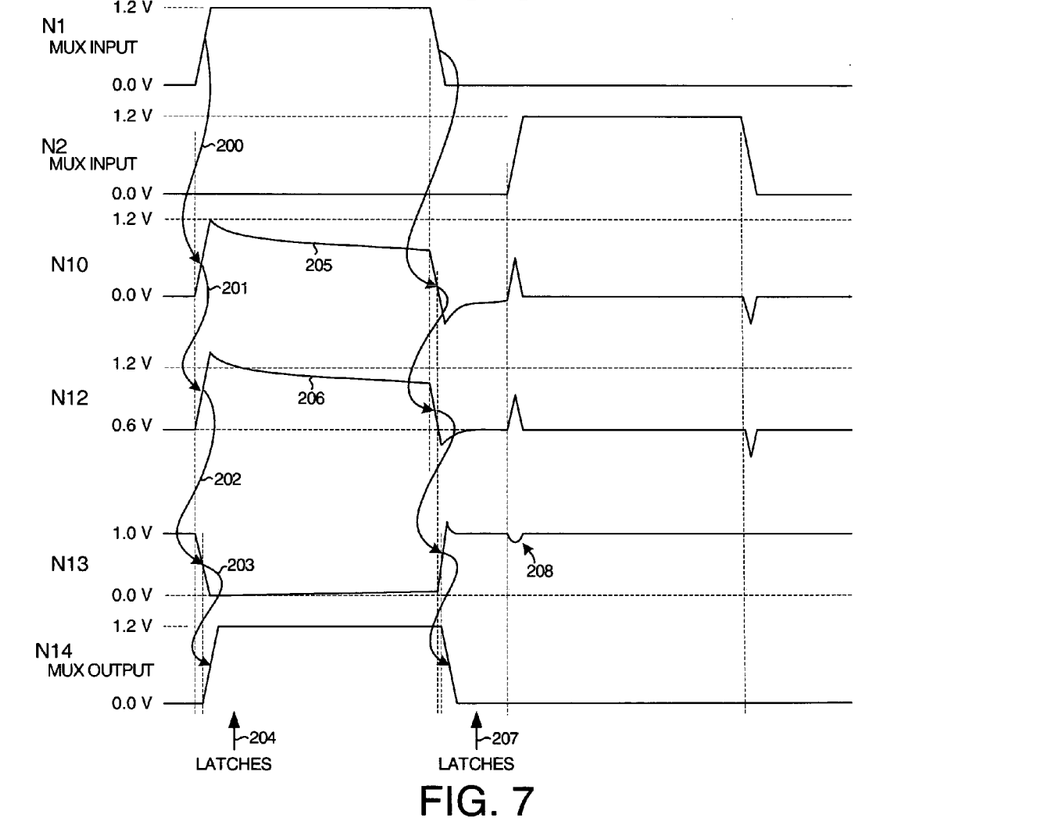
FIG. 7 is a simplified diagram showing waveforms of signals within the multiplexer structure of FIG. 5.

FIG. 7 is a simplified waveform diagram that illustrates how a signal present on a selected one of the data input leads of the multiplexer structure 100 of FIG. 5 is communicated through multiplexer structure 100 to the data output lead 109 without a signal present on any of the non-selected data input leads being communicated through to the data output lead 109. The waveforms of FIG. 7 are not to scale, but rather are presented in simplified form to illustrate the general operation of the multiplexer structure 100. Accurate waveforms can be generated using standard circuit simulation software and models particular to the particular process technology and transistor structures used to implement the multiplexer structure.

In the example of FIG. 7, memory cell structures 113–122 are loaded such that data input lead 101 is selected and such that the other data input leads 102–108 are not selected. The waveform labeled N1 in FIG. 7 is the waveform of a signal present on data input lead 101. Multiplexer structure 100 communicates this signal to its data output lead 109. The bottom N14 waveform is the waveform of the signal output onto data output lead 109. Data output lead 109 is designated to be node N14 in FIG. 5. The "N" designations on the waveform diagram of FIG. 7 correspond to the "N" node designations in FIG. 5.

Because data input lead 102 is not selected, a signal present on data input lead 102 is not to be communicated through multiplexer structure 100 to output data lead 109. The N2 waveform second from the top is the waveform of a signal present on data input lead 102. Note that the rising pulse in the N2 waveform is not seen in the N14 waveform of the signal on multiplexer output lead 109. Memory cell structures 113 and 121 are loaded with digital "0"s such that the Q output leads of these memory cell structures 113 and 121 are allowed to float. All other memory cell structures are loaded with digital "1"s.

In operation, the rising edge of the N1 waveform is capacitively coupled through SCC structure 123 and onto node N10. This is illustrated by arrow 200. Because memory cell structure 121 is loaded with a digital "0", and thus is allowed to float, the rising edge is similarly coupled through capacitors 138 and 139 and onto node N12. This is illustrated by arrow 201. Before the arrival of the signal edge, node N12 was biased by amplifier portion 132 at approximately 0.6 volts. The N12 waveform therefore shows the signal on node N12 starting from 0.6 volts rather than zero volts. The approximately 1.2 volt magnitude of the rising edge on node N10 is therefore imposed upon the 0.6 bias voltage as illustrated in waveform N12. The peak of the rising edge on node N12 exceeds 1.2 volts in magnitude. Amplifier 135 amplifies and inverts the signal edge on node N12 and outputs a falling edge signal as seen in the N13 waveform. Propagation delay through amplifier 135 is minimal because amplifier 135 is biased before the arrival of the signal edge at the amplifier's switching point. Amplifier 135 therefore starts to change its output signal voltage on node N13 almost immediately upon the voltage of the signal on node N12 starting to rise. This is illustrated by arrow 202.

The falling edge of the signal on node N13 overpowers the weak keeper inverter of latch portion 133. Inverter 136 propagates the edge onto data output lead 109 as illustrated by arrow 203. A short time later, the digital high signal on node N14 causes the weak keeper inverter to switch and start holding the signal on node N13 at a digital low. Latch portion 133 is then latched. This is represented by arrow 204 at the bottom of the waveform diagram.

After the rising edge of the signal on node N1 has been coupled through to node N10, the charge on node N10 starts to leak off due to parasitic resistances. The voltage on node N10 therefore falls slowly. This is represented by the downward slope 205 in the N10 waveform. The same charge leaking phenomenon occurs on node N12. This is represented by the downward slope 206 in the N12 waveform. These falling voltages, as well as the corresponding rising slope of the signal on node N13, do not affect the signal on data output lead 109, however, because latch portion 133 remains latched.

Next, the falling edge of the signal on node N1 is received. This falling edge propagates through the multiplexer structure 100 in similar fashion to the way the rising edge did. Notice the 0.6 volt offset between the signals on node N10 and biased node N12. Because the voltage on node N12 only momentarily falls below 0.6 volts and then quickly returns to the 0.6 volts bias voltage, amplifier 135 does not receive an input voltage adequately low to result in a full 1.2 volt digital high being output by amplifier 135. This is represented in the N13 waveform by the signal on node N13 returning to 1.0 volts. This 1.0 volt output voltage is the voltage output by amplifier 135 when the input lead of amplifier 135 is receiving a 0.6 input voltage.

The rising edge of the signal on node N13 causes inverter 136 of latch portion 133 to output a corresponding falling edge. When the weak keeper inverter switches, latch portion 133 has latched in the new "0" digital logic value. This latching is represented in FIG. 7 by the arrow 207.

In the present illustrative operational example, a rising edge is then received on the second data input lead 102 of the multiplexer structure 100. This is represented by the rising edge in the N2 waveform. Because the corresponding memory cell structure 114 is loaded with a digital logic "1", memory cell structure 114 holds the common center plate of its corresponding SCC structure grounded. Very little AC coupling therefore occurs through the SCC structure and to node N10. So little coupling occurs that the pulse appearing on node N12 is of such a short duration and of such a small magnitude that amplifier 135 only starts to change the voltage on its output when the pulse on the input lead of amplifier 135 is removed. The resulting slight dip 208 in the voltage on node N13 is not of sufficient magnitude that the trip point of latch 136 is reached. Dip 208 is also of a shorter duration that the propagation delay through inverter 136 and back to node N13 through the weak keeper inverter. Latch portion 133 therefore is not relatched and does not output a rising edge. The signal on the unselected data input lead 102 is effectively therefore blocked by the multiplexer structure 100 and does not propagate through to data output lead 109. Accordingly, inverter structure 100 operates as desired.

In one embodiment, multiplexer structure 100 is fabricated using 90 nanometer CMOS technology. The delay of output latch 133 represented by arrow 203 in FIG. 7 is approximately 15 picoseconds when output latch 133 is not driving a load. The total delay through multiplexer structure 100 from data input lead 101 to data output lead 109 is less then 50 picoseconds.

Figure 8:
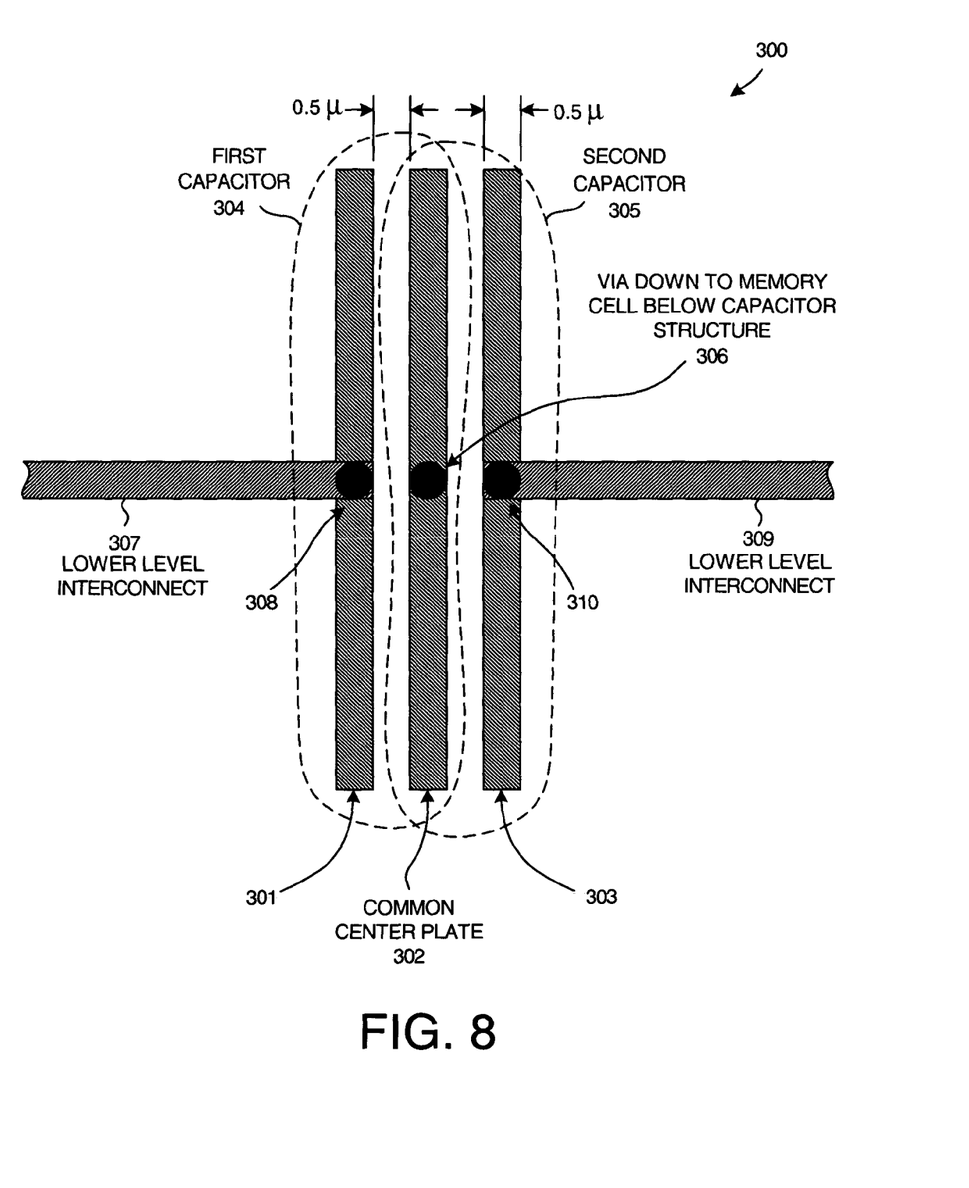
FIG. 8 is a simplified top-down view of one specific embodiment of a series capacitor coupling (SCC) structure.

FIG. 8 is a simplified top-down diagram of one embodiment of a series capacitor coupling (SCC) structure 300. SCC structure 300 includes a first plate 301, a second plate 302 (called the common center plate), and a third plate 303. First plate and second plate 302 form a first 0.02 pF capacitor 304. Second plate 302 and third plate 303 form a second 0.02 pF capacitor 305. The first, second and third plates are strips of metalization in an upper layer of an integrated circuit device. The sidewall capacitance of the relatively tall metal structures being spaced close to one another is used to realize the desired 0.02 pF capacitance. In this embodiment, the plates are aluminum strips that are 1.0 microns tall, are 0.5 microns wide, and are spaced from one another by 0.5 microns. The 0.02 pF capacitance is, however, the total capacitance between the plates and is not due only to the sidewall capacitance between the metal strips. The dielectric material between the strips is the same deposited silicon dioxide used elsewhere on the integrated circuit between the various layers of interconnect of the integrated circuit.

In the SCC structure of FIG. 8, a conductive via or stack of conductive vias 306 extends from the common center plate 302 downward through the various layers of the integrated circuit to a memory cell structure formed in the semiconductor substrate material below the capacitor structure. The memory cell structure stores a bit of control information that controls the SCC structure.

The first and third plates 301 and 303 can, for example, be connected to other circuitry using higher speed metalization in lower levels of the integrated circuit. FIG. 8 shows a first piece of lower level interconnect 307 connected to first plate 301 by a conductive via 308. A piece of lower level interconnect 309 is shown connected to third plate 303 by a conductive via 310.

Although each of the SCC structures in the specific embodiment of FIG. 5 has its own associated memory cell structure, this need not be the case. A single memory cell structure can control multiple SCC structures. Signals output from a plurality memory cell structures can be decoded to generate the signals needed to control SCC structures. A single stage of SCC structures can be used to realize a multiplexer structure. Multiple stages of SCC structures can be used to realize multiplexer structures. In one embodiment, two SCC structures of a 2-to-1 multiplexer stage are controlled by a single memory cell structure, where one of the SCC structures is controlled by the Q output of the memory cell structure, and where the other of the SCC structures is controlled by a QB output of the memory cell structure. A QB output of a memory cell structure is illustrated in dashed lines in FIG. 6.

The structure of FIG. 5 includes a two-to-one multiplexer. The two-to-one multiplexer includes the two SCC structures of multiplexer stage 112, the associated memory cell structures, and the output latch 131. Nodes N10 and N15 are the two data input leads of the two-to-one multiplexer structure.

Although the specific embodiment of FIG. 5 includes an amplifier portion 132, an amplifier may not be necessary in some implementations of the multiplexer structure. Although a particular biasing structure involving a string of diode-connected transistors is illustrated in FIG. 5, other biasing structures are possible. Node N12 of the multiplexer structure of FIG. 5 may, for example, be coupled to a center tap of a voltage dividing resistor string.

Although the use of lower level interconnect is described above in connection with one specific embodiment of an SCC structure, it is to be understood that metalization in the same layer as the plates of the SCC structure can be used to connect the SCC to other circuitry. For example, a second similar SCC structure can be located in close proximity to a first SCC structure such that the third plates of the two SCC structures are the same strip of metalization. The first SCC structure can be disposed on one side of the common strip of metalization, whereas the second SCC structure is a mirror image of the first SCC structure and is disposed on the other side of the strip. Capacitors of the SCC structures of a multi-stage multiplexer structure can be made very compact by eliminating intervening nodes between SCC structures and thereby sharing capacitor plates between adjacent SCC structures.

Figure 9:
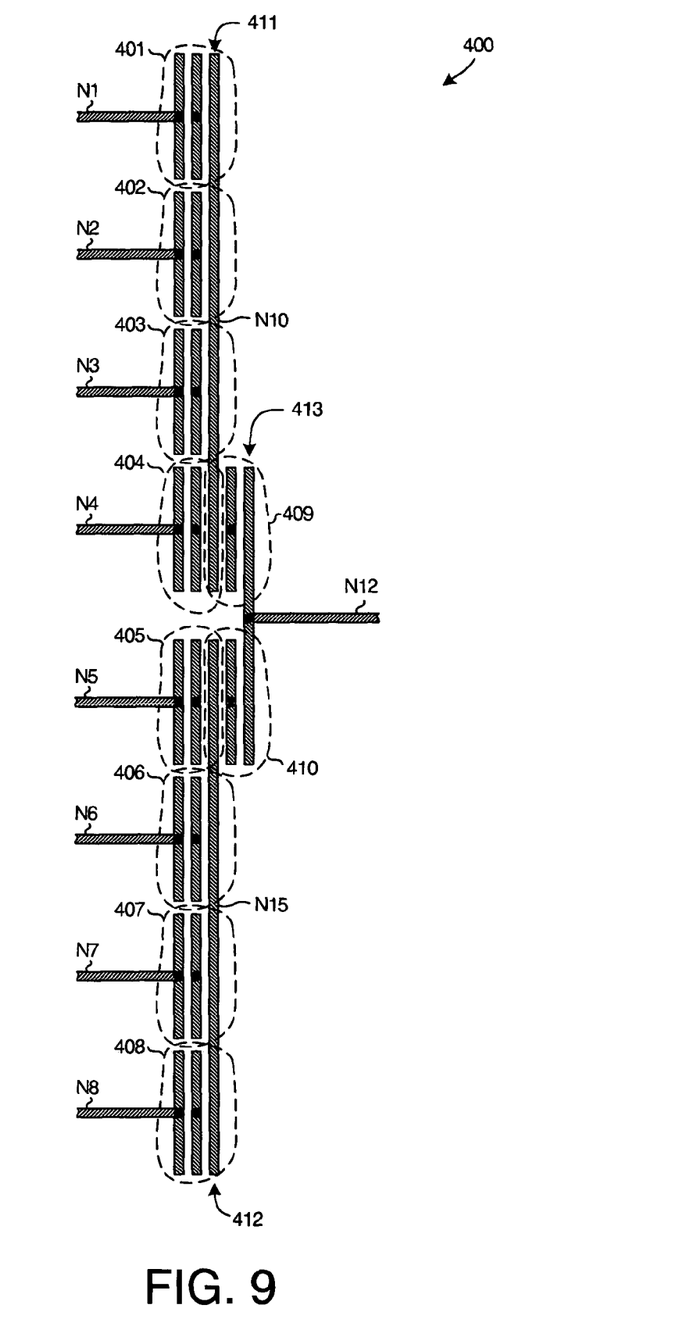
FIG. 9 is a top-down diagram of a structure that can be used to implement the two-stage tree structure 110 in the embodiment of FIG. 5.

FIG. 9 is a top-down diagram of a structure 400 that includes ten series capacitor coupling (SCC) structures 401–410. Each of the four SCC structures 401–404 shares a plate 411. Each of the four SCC structures 405–408 shares a plate 412. SCC structures 409 and 410 share a plate 413. The structure 400 of FIG. 9 can be used to implement the two-stage multiplexer tree structure 110 of the multiplexer structure 100 of FIG. 5. The "N" node numbers on FIG. 9 indicate the same nodes as are indicated by like "N" node numbers in FIG. 5.

Although certain specific exemplary embodiments are described above in order to illustrate the invention, the invention is not limited to the specific embodiments. The capacitors of an SCC structure can be made in many different ways and can have many different geometries. The capacitors of an SCC structure can, for example, involve three planar metal plates that are disposed on top of each other in a stack. A thin layer of dielectric material separates the bottom plate from the center plate. Another thin layer of dielectric material separates the middle plate from the upper plate. The center planar plate is coupled to, or is, the control lead of the SCC structure. One or more of the plates can be made of semiconductor material. The multiplexer can be part of a stacked die structure such that part of the multiplexer structure is on one die, and the remainder of the multiplexer structure is on the other die. The part of the multiplexer structure on one die is capacitively coupled to the other part of the multiplexer structure on the other die. An SCC structure can straddle two dice of a stacked die assembly. Although the SCC multiplexer structure is particularly suitable for use in programmable logic devices, the SCC multiplexer structure can be employed in other integrated circuits and applications where high speed and/or low leakage current is desired. An edge sensitive device other than a latch can be used to recreate an incoming digital signal and supply the signal onto a multiplexer data output lead. In some applications, only a tree of SCC structures need be used and no output latch or other edge sensitive device is provided. Accordingly, various modifications, adaptations, and combinations of various features of the described embodiments can be practiced without departing from the scope of the invention as set forth in the following claims.

The invention claimed is:

1. A multiplexer having a first data input lead, a second data input lead, and a data output lead, the multiplexer structure comprising:
    a plurality of series capacitor coupling (SCC) structures, each SCC structure having an input lead, a control lead, and an output lead, wherein the input lead is capacitively coupled to the output lead when the control lead is floating, and wherein the input lead is de-coupled from the output lead when the control lead is driven with a DC voltage, wherein the input lead of a first of the SCC structures is the first data input lead of the multiplexer, and wherein the input lead of a second of the SCC structures is the second data input lead of the multiplexer, and wherein the output lead of the first SCC structure is coupled to the output lead of the second SCC structure;
    an output latch having an input lead and an output lead, the input lead of the output latch being coupled to the output lead of the first SCC structure, the output lead of the output latch being the data output lead of the multiplexer; and
    wherein capacitive plates form the input lead, the control lead, and the output lead of each SCC structure.

2. The multiplexer of claim 1, wherein the DC voltage is ground potential.

3. The multiplexer of claim 1, further comprising;
    a memory cell structure that stores one bit of digital information, the memory cell structure having a first output lead that is driven with the DC voltage by the memory cell structure when the bit has a first digital value, and wherein the first output lead is not driven by the memory cell structure when the bit has a second digital value, wherein the first output lead of the memory cell structure is coupled to the control lead of the first SCC structure.

4. The multiplexer of claim 3, wherein the memory cell structure has a second output lead, wherein the second output lead is driven with the DC voltage by the memory cell structure when the bit has the second digital value, and wherein the second output lead is not driven by the memory cell structure when the bit has the second digital value, and wherein the second output lead of the memory cell structure is coupled to the control lead of the second SCC structure.

5. The multiplexer of claim 1, wherein the output latch comprises an amplifier portion and a latch portion, the amplifier portion amplifying a signal present on the input lead of the output latch and outputting an amplified form of the signal to the latch portion.

6. The multiplexer of claim 1, wherein each of the SCC structures comprises a first capacitor plate that extends in a first plane, a second capacitor plate that extends in a second plane parallel to the first plane, and a third capacitor plate that extends in a third plane parallel to the second plane, wherein the first capacitor plate is the input lead of the SCC structure, wherein the second capacitor plate is the control lead of the SCC structure, and wherein the third capacitor plate is the output lead of the SCC structure.

7. The multiplexer of claim 6, further comprising:
    a memory cell structure that stores one bit of digital information, the memory cell structure having a first output lead that is driven with the DC voltage by the memory cell structure when the bit has a first digital value, and wherein the first output lead is not driven by the memory cell structure when the bit has a second digital value, wherein the first output lead of the memory cell structure is coupled to the control lead of the first SCC structure, wherein the memory cell structure has a second output lead, wherein the second output lead is driven with the DC voltage by the memory cell structure when the bit has the second digital value, and wherein the second output lead is not driven by the memory cell structure when the bit has the first digital value, and wherein the second output lead of the memory cell structure is coupled to the control lead of the second SCC structure.

8. The multiplexer of claim 6, further comprising:
a first memory cell structure that stores one bit of digital information, the first memory cell structure having an output lead that is driven with the DC voltage by the first memory cell structure when the bit has a first digital value, and wherein the output lead is not driven by the first memory cell structure when the bit has a second digital value, wherein the output lead of the first memory cell structure is coupled to the control lead of the first SCC structure; and
a second memory cell structure that stores one bit of digital information, the second memory cell structure having an output lead that is driven with the DC voltage by the second memory cell structure when the bit has a first digital value, and wherein the output lead is not driven by the second memory cell structure when the bit has a second digital value, wherein the output lead of the second memory cell structure is coupled to the control lead of the second SCC structure.

9. The multiplexer of claim 1, wherein the multiplexer is part of a programmable interconnect structure of a programmable logic device.

10. The multiplexer of claim 1, wherein the multiplexer is part of a programmable interconnect structure of a field programmable gate array, and wherein which of the first and second data input leads is coupled through the multiplexer to the data output lead is determined by a bit of configuration information stored on the field programmable gate array in a memory cell.

11. The multiplexer of claim 1, wherein the multiplexer is a two-to-one multiplexer that is a part of a larger multiplexer, wherein the larger multiplexer includes SCC structures in addition to the first and second SCC structures that are part of the two-to-one multiplexer.

12. The multiplexer of claim 11, wherein the larger multiplexer is an N-to-1 multiplexer having N data input leads, wherein which of the N data input leads is coupled to a data output lead of the N-to-1 multiplexer is determined by a plurality of bits A of control information, each of the bits of control information being stored in a separate memory cell, wherein 2 to the power A is equal to N.

13. A method, comprising:
using a plurality of series capacitor coupling (SCC) structures to capacitively couple a selected one of a plurality of data input leads to an intervening node such that a signal edge of a first digital signal on the selected data input lead is coupled onto the intervening node and such that a signal edge of a second digital signal on another of the data input leads is blocked from being coupled onto the intervening node;
latching the signal edge of the first digital signal on the intervening node to generate a digital output signal, wherein the digital output signal is a delayed version of the first digital signal; and
wherein each of the SCC structures includes a first capacitor and a second capacitor, the first and second capacitors being connected together in series.

14. The method of claim 13, further comprising:
storing a bit of configuration information in a memory cell structure, the bit of configuration information determining which of the plurality of data input leads is the selected data input lead.

15. The method of claim 13, further comprising:
biasing the intervening node with a bias voltage such that the intervening node is biased at the bias voltage immediately prior to the signal edge of the first digital signal being coupled onto the intervening node.

16. The method of claim 13, wherein the first and second digital signals are signals propagating in an programmable interconnect structure of a field programmable gate array.

17. The method of claim 16, further comprising:
supplying the digital output signal to an input lead of a block of configurable logic, the block of configurable logic being a part of the field programmable gate array.

18. The method of claim 13, wherein the plurality of series capacitor coupling (SCC) structures that capacitively couples the selected data input lead to the intervening node is a multi-stage tree of SCC structures.

19. A multiplexer having a plurality of data input leads and a data output lead, the multiplexer comprising:
means for capacitively coupling a selected one of the plurality of data input leads to an intermediate node; and
an output latch having an input lead and an output lead, the input lead being coupled to the intermediate node, the output lead being coupled to the data output lead of the multiplexer.

20. The multiplexer of claim 19, wherein the means comprises at least one memory cell that stores at least one bit of configuration information, the configuration information determining which of the plurality of data input leads is the selected data input lead.

* * * * *